United States Patent
Zhang et al.

(10) Patent No.: US 10,510,279 B2
(45) Date of Patent: Dec. 17, 2019

(54) SHIFT REGISTER UNITS, GATE SCANNING CIRCUITS, DRIVING METHODS AND DISPLAY APPARATUSES

(71) Applicants: BOE TECHNOLOGY GROUP CO., LTD., Beijing (CN); Beijing BOE Display Technology Co., Ltd., Beijing (CN)

(72) Inventors: Xiaoxiang Zhang, Beijing (CN); Xi Chen, Beijing (CN); Mingxuan Liu, Beijing (CN); Huibin Guo, Beijing (CN); Liping Luo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 134 days.

(21) Appl. No.: 15/751,120

(22) PCT Filed: Jul. 24, 2017

(86) PCT No.: PCT/CN2017/094064
§ 371 (c)(1),
(2) Date: Feb. 7, 2018

(87) PCT Pub. No.: WO2018/059093
PCT Pub. Date: Apr. 5, 2018

(65) Prior Publication Data
US 2019/0340967 A1 Nov. 7, 2019

(30) Foreign Application Priority Data
Sep. 30, 2016 (CN) .......................... 2016 1 0875041

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2014/0192039 A1* 7/2014 Wang ..................... G11C 19/28
345/213
2014/0240209 A1 8/2014 Zhang
(Continued)

FOREIGN PATENT DOCUMENTS

CN 102654986 A 9/2012
CN 202443728 U 9/2012
(Continued)

OTHER PUBLICATIONS

English Translation of International Search Report & Written Opinion, for PCT Patent Application No. PCT/CN2017/094064, dated Oct. 11, 2017, 9 pages.
(Continued)

*Primary Examiner* — Duane N Taylor, Jr.
(74) *Attorney, Agent, or Firm* — Kinney & Lange, P.A.

(57) ABSTRACT

The present disclosure provides a shift register unit, a gate scanning circuit, a driving method, and a display apparatus. The shift register unit comprises a reset circuit configured to transmit a signal from a signal control terminal to a first node and a shift register unit signal output terminal under the control of a reset control signal input terminal; a first pull-down control circuit configured to transmit the signal from the signal control terminal to the first node and the shift register unit signal output terminal under the control of a second node; and a second pull-down control circuit con-
(Continued)

figured to transmit the signal from the signal control terminal to the first node and the shift register unit signal output terminal under the control of a third node control signal input terminal coupled to a third node, so as to cooperate with the reset circuit and the first pull-down control circuit to jointly reset the shift register unit in a phase in which output of the shift register unit should not occur, thereby effectively preventing output of the shift register unit from occurring in the phase in which output of the shift register unit should not occur.

18 Claims, 6 Drawing Sheets

(56) References Cited

U.S. PATENT DOCUMENTS

| | | |
|---|---|---|
| 2015/0029082 A1 | 1/2015 | Jeon et al. |
| 2016/0351159 A1 | 12/2016 | Yang et al. |

FOREIGN PATENT DOCUMENTS

| | | |
|---|---|---|
| CN | 104464600 A | 3/2015 |
| CN | 105810170 A | 7/2016 |
| CN | 205582492 U | 9/2016 |
| CN | 205595037 U | 9/2016 |
| CN | 106448533 A | 2/2017 |
| KR | 20060091465 A | 2/2005 |

OTHER PUBLICATIONS

First Chinese Office Action dated Nov. 2, 2018 for corresponding Chinese Application No. 201610875041.4.

\* cited by examiner

SHIFT REGISTER UNITS, GATE SCANNING CIRCUITS, DRIVING METHODS AND DISPLAY APPARATUSES

CROSS-REFERENCE TO RELATED APPLICATION(S)

This application is a U.S. National Stage Application of PCT International Application No. PCT/CN2017/094064, filed on Jul. 24, 2017, entitled "SHIFT REGISTER UNITS, GATE SCANNING CIRCUITS, DRIVING METHODS AND DISPLAY APPARATUSES," which claims priority to the Chinese Patent Application No. 201610875041.4, filed on Sep. 30, 2016, entitled "SHIFT REGISTER UNITS, GATE SCANNING CIRCUITS, DRIVING METHODS AND DISPLAY APPARATUSES," which are incorporated herein by reference in their entireties.

TECHNICAL FIELD

The present disclosure relates to the field of display technologies, and more particularly, to a shift register unit, a gate scanning circuit, a driving method and a display apparatus.

BACKGROUND

The Gate Driver On Array (GOA) is an important means for realizing narrowing of a bezel of a display apparatus. In general, a GOA is composed of multiple stages of shift register (sometimes referred to as SR hereinafter) units, and various stages of shift register units sequentially shift to output a scanning pulse to gates of thin film transistors in each row of pixel units, so that the corresponding thin film transistors are turned on to realize a process of driving each row of pixel units.

SUMMARY

The present disclosure provides a shift register unit, a gate scanning circuit and a driving method thereof, and a display apparatus.

In an aspect, there is provided a shift register unit, comprising an output circuit, an input circuit, a reset circuit, a first pull-down control circuit, a second pull-down control circuit, and a second node control circuit, wherein the output circuit is coupled to a first node, a first clock signal input terminal and a shift register unit output terminal, and is configured to transmit a signal from the first clock signal input terminal to the shift register unit output terminal under the control of the first node;

the input circuit is coupled to the first node and a shift register unit input terminal, and is configured to transmit a signal from the shift register unit input terminal to the first node under the control of the shift register unit input terminal;

the reset circuit is coupled to a reset control signal input terminal, the first node, the shift register unit signal output terminal and a signal control terminal, and is configured to transmit a signal from the signal control terminal to the first node and the shift register unit signal output terminal under the control of the reset control signal input terminal;

the first pull-down control circuit is coupled to a second node, the first node, the shift register unit signal output terminal and the signal control terminal, and is configured to transmit the signal from the signal control terminal to the first node and the shift register unit signal output terminal under the control of the second node;

the second pull-down control circuit is coupled to a third node, the first node, the shift register unit signal output terminal and the signal control terminal, and is configured to transmit the signal from the signal control terminal to the first node and the shift register unit signal output terminal under the control of the third node;

the second node control circuit is coupled to the first node, the second node, a second clock signal input terminal and the signal control terminal, and is configured to output the signal from the signal control terminal or a signal from the second clock signal input terminal to the second node under the control of the first node and the second clock signal input terminal.

In some embodiments, the reset circuit comprises a second transistor and a fifth transistor, wherein the second transistor has a gate coupled to the reset control signal input terminal, one of a source and a drain coupled to the first node, and the other of the source and the drain coupled to the signal control terminal, and is configured to turn on or turn off a connection between the first node and the signal control terminal under the control of the reset control signal input terminal; and the fifth transistor has a gate coupled to the reset control signal input terminal, one of a source and a drain coupled to the shift register unit output terminal, and the other of the source and the drain coupled to the signal control terminal, and is configured to turn on or turn off a connection between the shift register unit output terminal and the signal control terminal under the control of the reset control signal input terminal.

In some embodiments, the first pull-down control circuit comprises a third transistor and a sixth transistor, wherein the third transistor has a gate coupled to the second node, one of a source and a drain coupled to the first node, and the other of the source and the drain coupled to the signal control terminal, and is configured to turn on or turn off a connection between the first node and the signal control terminal under the control of the second node; and the sixth transistor has a gate coupled to the second node, one of a source and a drain coupled to the shift register unit signal output terminal, and the other of the source and the drain coupled to the signal control terminal, and is configured to turn on or turn off a connection between the shift register unit signal output terminal and the signal control terminal under the control of the second node.

In some embodiments, the second pull-down control circuit comprises a first transistor and a fourth transistor, wherein the first transistor has a gate coupled to the third node, one of a source and a drain coupled to the first node, and the other of the source and the drain coupled to the signal control terminal, and is configured to turn on a connection between the first node and the signal control terminal under the control of the third node; and the fourth transistor has a gate coupled to the third node, one of a source and a drain coupled to the shift register unit output terminal, and the other of the source and the drain coupled to the signal control terminal, and is configured to turn on or turn off a connection between the shift register unit output terminal and the signal control terminal under the control of the third node.

In some embodiments, the second node control circuit comprises an eighth transistor, a ninth transistor, a tenth transistor, and an eleventh transistor, wherein the eighth transistor has a gate and one of a source and a drain coupled to the second clock signal input terminal, and the other of the source and the drain coupled to a fourth node, and is configured to turn on or turn off a connection between the second clock signal input terminal and the fourth node under the control of the second clock signal input terminal;

the ninth transistor has a gate coupled to the fourth node, one of a source and a drain coupled to the second clock signal input terminal, and the other of the source and the drain coupled to the second node, and is configured to turn on or turn off a connection between the second clock signal input terminal and the second node under the control of the fourth node;

the tenth transistor has a gate coupled to the first node, one of a source and a drain coupled to the fourth node, and the other of the source and the drain coupled to the signal control terminal, and is configured to turn on or turn off a connection between the fourth node and the signal control terminal under the control of the first node; and the eleventh transistor has a gate coupled to the first node, one of a source and a drain coupled to the second node, and the other of the source and the drain coupled to the signal control terminal, and is configured to turn on or turn off a connection between the second node and the signal control terminal under the control of the first node.

In some embodiments, the shift register unit further comprises a third pull-down control circuit, wherein the third pull-down control circuit is coupled to the second clock signal input terminal, the shift register unit signal output terminal and the signal control terminal, and is configured to transmit the signal from the signal control terminal to the shift register unit signal output terminal under the control of the second clock signal input terminal.

In some embodiments, the third pull-down control circuit comprises a seventh transistor, wherein the seventh transistor has a gate coupled to the second clock signal input terminal, one of a source and a drain coupled to the shift register unit signal output terminal, and the other of the source and the drain coupled to the signal control terminal, and is configured to turn on or turn off a connection between the shift register unit signal output terminal and the signal control terminal under the control of the second clock signal input terminal.

In some embodiments, the input circuit comprises a twelfth transistor, wherein the twelfth transistor has a gate coupled to the shift register unit input terminal, one of a source and a drain coupled to the shift register unit input terminal, and the other of the source and the drain coupled to the first node, and is configured to turn on or turn off a connection between the shift register unit input terminal and the first node under the control of the shift register unit input terminal.

In some embodiments, the output circuit comprises a thirteenth transistor and a first capacitor, wherein the thirteenth transistor has a gate coupled to the first node, one of a source and a drain coupled to the first clock signal input terminal, and the other of the source and the drain coupled to the shift register unit output terminal, and is configured to turn on or turn off a connection between the first clock signal input terminal and the shift register unit output terminal under the control of the first node, and the first capacitor has one terminal coupled to the first node, and the other terminal coupled to the shift register unit signal output terminal.

In another aspect, there is provided a gate scanning circuit, comprising a plurality of the cascaded shift register units described above, wherein the gate scanning circuit further comprises a plurality of clock signal lines, wherein each of shift register units at odd-numbered stages has a first clock signal input terminal coupled to a first clock signal line, and a second clock signal input terminal coupled to a second clock signal line; and each of shift register units at even-numbered stages has a first clock signal input terminal coupled to the second clock signal line, and a second clock signal input terminal coupled to the first clock signal line; and in shift register units at two adjacent stages, a shift register unit at a previous stage has a shift register unit output terminal coupled to a shift register unit input terminal of a shift register unit at a next stage, a reset control signal input terminal coupled to a shift register unit output terminal of the shift register unit at the next stage, and a third node coupled to a second node of the shift register unit at the next stage.

In another aspect, there is further provided a driving method for driving the gate scanning circuit described above, comprising:

in an auxiliary reset phase, resetting, by a third node of a shift register unit at the $n^{th}$ stage, the shift register unit the $n^{th}$ stage under the control of a second node of a shift register unit at the $(n+1)^{th}$ stage, where n is a positive integer.

In another aspect, there is provided a display apparatus, comprising the gate scanning circuit described above.

BRIEF DESCRIPTION OF THE DRAWINGS

Feature information and advantages of the present disclosure will be more clearly understood with reference to the following accompanying drawings, which are intended to be illustrative and not to be construed as limiting the present disclosure in any way, wherein in the accompanying drawings.

DETAILED DESCRIPTION

In order to more clearly understand the above purposes, features and advantages of the present disclosure, the present disclosure will be further described in detail below with reference to the accompanying drawings and specific embodiments. It should be illustrated that, the embodiments of the present application and the features in the embodiments can be combined with each other without conflict.

In the following description, numerous specific details are set forth in order to provide a thorough understanding of the present disclosure. However, the present disclosure can also be implemented in other ways than the ones described herein. Therefore, the protection scope of the present disclosure is not limited to specific embodiments disclosed hereinafter.

Figure 1:
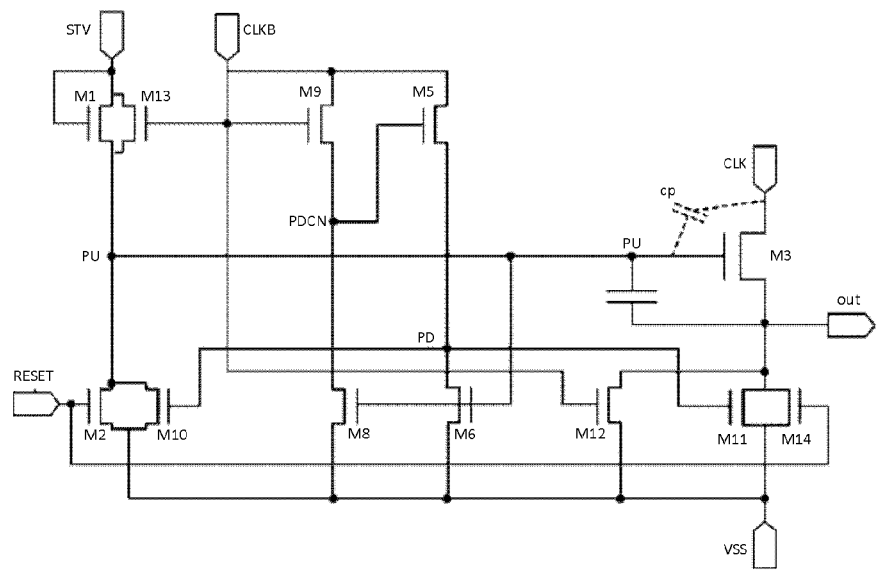
FIG. 1 is a structural diagram of a related shift register unit.
Figure 2:
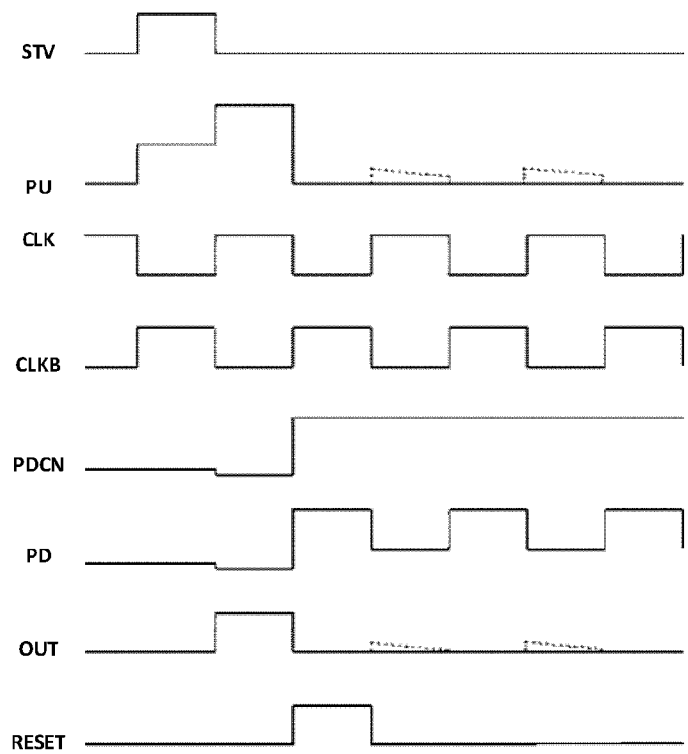
FIG. 2 is a timing diagram corresponding to a related shift register unit.

The shift register unit at each stage in a gate driving circuit which is common in the related art is primarily composed of a Thin Film Transistor (sometimes simply referred to as TFT hereinafter) and a capacitor device, as shown in FIG. 1. For the shift register unit shown in FIG. 1 (a timing diagram thereof is shown in FIG. 2), in a process of outputting a next scanning pulse after a current scanning pulse is output, due to the presence of a coupling capacitor CP, a node PU and a node OUT are easily affected by a high level signal from CLK, which results in easy accumulation of charges on the node PU and the node OUT. Especially in a case of operating at a high temperature, a threshold voltage of the thin film transistor TFT may drift due to a drift in the temperature, which results in more serious accumulation of charges on the node PU and the node OUT, and thereby may lead to an erroneous output of the shift register unit. How to improve the reset capability of these key nodes and avoid the accumulation of charges on these key nodes is an important issue for such gate driving circuits.

The present disclosure aims to provide a novel shift register unit for improving the reset capability of shift register units therein so as to prevent a level corresponding to a scanning pulse from being erroneously output by the shift register unit at each stage therein in a phase in which the scanning pulse should not be output.

Figure 3:
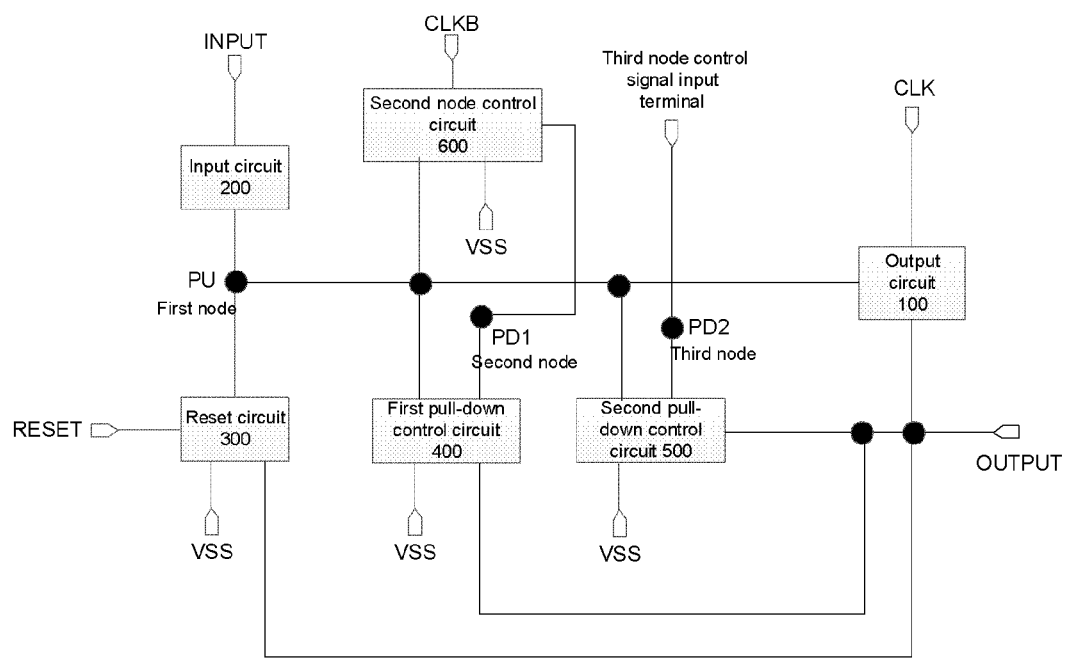
FIG. 3 is a modular structure diagram of a shift register unit according to the present disclosure.

According to some embodiments of the present disclosure, there is provided a shift register unit, which, as shown in FIG. 3, comprises an output circuit 100, an input circuit 200, a reset circuit 300, a first pull-down control circuit 400, a second pull-down control circuit 500 and a second node control circuit 600.

The output circuit 100 is coupled to a first node PU, a first clock signal input terminal CLK and a shift register unit output terminal OUTPUT, and is configured to transmit a signal from the first clock signal input terminal CLK to the shift register unit output terminal OUTPUT under the control of the first node PU.

The input circuit 200 is coupled to the first node PU and a shift register unit input terminal INPUT, and is configured to transmit a signal from the shift register unit input terminal INPUT to the first node PU under the control of a signal from the shift register unit input terminal INPUT.

The reset circuit 300 is coupled to a reset control signal input terminal RESET, the first node PU, the shift register unit signal output terminal OUTPUT and a signal control terminal VSS, and is configured to transmit a signal from the signal control terminal VSS to the first node PU and the shift register unit signal output terminal OUTPUT under the control of a signal from the reset control signal input terminal RESET.

The first pull-down control circuit 400 is coupled to a second node PD1, the first node PU, the shift register unit signal output terminal OUTPUT and the signal control terminal VSS, and is configured to transmit the signal from the signal control terminal VSS to the first node PU and the shift register unit signal output terminal OUTPUT under the control of the second node PD1.

The second pull-down control circuit 500 is coupled to a third node PD2, the first node PU, the shift register unit signal output terminal OUTPUT and the signal control terminal VSS, and is configured to transmit the signal from the signal control terminal VSS to the first node PU and the shift register unit signal output terminal OUTPUT under the control of the third node PD2.

The second node control circuit 600 is coupled to the first node PU, the second node PD1, a second clock signal input terminal CLKB and the signal control terminal VSS, and is configured to output the signal from the signal control terminal VSS or a signal from the second clock signal input terminal CLKB to the second node PD1 under the control of the first node PU and the second clock signal input terminal CLKB.

The shift register unit further comprises a third node control signal input terminal coupled to the third node PD2.

In the shift register unit according to the present disclosure, the second pull-down control circuit 500 is coupled to the third node PD2 and is configured to cooperate with the reset circuit 300 and the first pull-down control circuit 400 under the control of a signal from the third node control signal input terminal, so as to jointly reset the shift register unit in a phase in which the shift register unit should not output a scanning pulse, thereby effectively preventing the shift register unit from outputting the scanning pulse in the phase in which the shift register unit should not output the scanning pulse.

Figure 4:
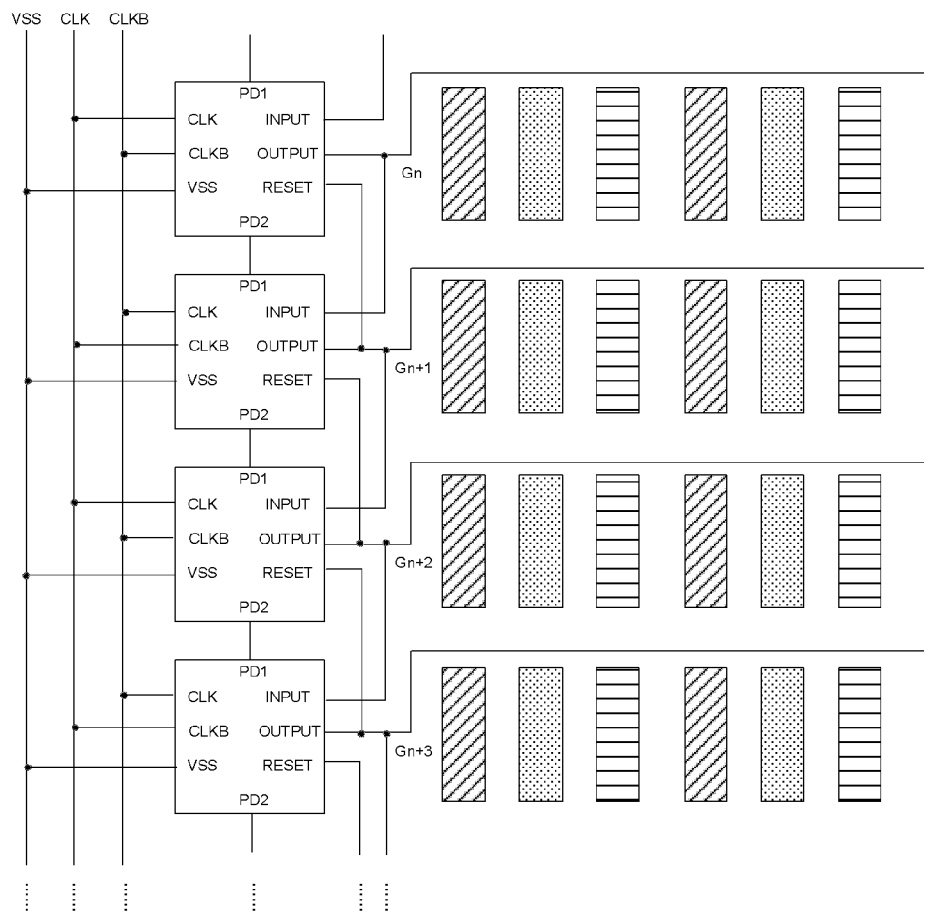
FIG. 4 is a structural circuit diagram of a gate scanning circuit according to the present disclosure.

According to some embodiments of the present disclosure, there is provided a gate scanning circuit, which, as shown in FIG. 4, comprises a plurality of cascaded shift register units which may be the shift register units described above, and the gate scanning circuit may further comprise a plurality of clock signal lines.

Each of shift register units at odd-numbered stages has a first clock signal input terminal CLK coupled to a first clock signal line CLK, and a second clock signal input terminal CLKB coupled to a second clock signal line CLKB; and each of shift register units at even-numbered stages has a first clock signal input terminal CLK coupled to the second clock signal line CLKB, and a second clock signal input terminal coupled to the first clock signal line CLK.

In shift register units at two adjacent stages, a shift register unit at a previous stage has a shift register unit output terminal OUTPUT coupled to a shift register unit input terminal INPUT of a shift register unit at a next stage, a reset control signal input terminal RESET coupled to a shift register unit output terminal OUTPUT of the shift register unit at the next stage, and a third node control signal input terminal (i.e., a third node PD2) coupled to a second node PD1 of the shift register unit at the next stage.

In the gate scanning circuit shown in FIG. 4, the third node control signal input terminal (i.e., the third node PD2) of the shift register unit at the previous stage is coupled to the second node PD1 of the shift register unit at the next stage, so that the second pull-down control circuit 500 in the shift register unit described above can cooperate with the reset circuit 300 and the first pull-down control circuit 400 under the control of the second node PD1 of the shift register unit at the next stage to jointly reset the shift register unit in a phase in which the shift register unit should not output a scanning pulse, thereby effectively preventing the shift register unit from outputting the scanning pulse in the phase in which the shift register unit should not output the scanning pulse.

The shift register unit according to the present disclosure will be described in detail below in combination with the circuit diagram shown in FIG. 6.

The reset circuit 300 may comprise a second transistor M2 and a fifth transistor M5. The second transistor M2 has a gate coupled to the reset control signal input terminal RESET, one of a source and a drain coupled to the first node PU, and the other of the source and the drain coupled to the signal control terminal VSS, and is configured to turn on or turn off a connection between the first node PU and the signal control terminal VSS under the control of the reset control signal input terminal RESET. The fifth transistor M5 has a gate coupled to the reset control signal input terminal RESET, one of a source and a drain coupled to the shift register unit output terminal OUTPUT, and the other of the source and the drain coupled to the signal control terminal VSS, and is configured to turn on or turn off a connection between the shift register unit output terminal OUTPUT and the signal control terminal VSS under the control of the reset control signal input terminal RESET.

An operation principle of the reset circuit 300 will be described in detail below by taking both the second transistor M2 and the fifth transistor M5 being N-type TFTs as an example. When the reset control signal input terminal RESET is at a low level, both the second transistor M2 and the fifth transistor M5 are turned off. At this time, signals at the first node PU and the shift register unit output terminal OUTPUT are not affected by the signal control terminal VSS. When the reset control signal input terminal RESET is at a high level, both the second transistor M2 and the fifth transistor M5 are turned on, so that a connection between the first node PU and the signal control terminal VSS is turned on and a connection between the shift register unit output terminal OUTPUT and the signal control terminal VSS is turned on. The signal control terminal VSS here may be a signal control terminal for applying a low level direct current signal, so that a voltage at the first node PU is set to a low level and a voltage at the shift register unit output terminal OUTPUT is set to a low level, thereby realizing a function of resetting the first node PU and the shift register unit output terminal OUTPUT. Of course, in a specific implementation, the reset circuit 300 here may also be implemented in other manners. Under the premise that the function of the reset circuit 300 described above can be realized, a specific structure of the reset circuit 300 does not affect the protection scope of the present disclosure.

The first pull-down control circuit 400 may comprise a third transistor M3 and a sixth transistor M6. The third transistor M3 has a gate coupled to the second node PD1, one of a source and a drain coupled to the first node PU, and the other of the source and the drain coupled to the signal control terminal VSS, and is configured to turn on or turn off a connection between the first node PU and the signal control terminal VSS under the control of the second node PD1. The sixth transistor M6 has a gate coupled to the second node PD1, one of a source and a drain coupled to the shift register unit signal output terminal OUTPUT, and the other of the source and the drain coupled to the signal control terminal VSS, and is configured to turn on or turn off a connection between the shift register unit signal output terminal OUTPUT and the signal control terminal VSS under the control of the second node PD1.

An operation principle of the first pull-down control circuit 400 will be described in detail below by taking both the third transistor M3 and the sixth transistor M6 being N-type TFTs as an example. When the second node PD1 is at a low level, both the third transistor M3 and the sixth transistor M6 are turned off. At this time, the signals at the first node PU and the shift register unit output terminal OUTPUT are not affected by the signal control terminal VSS. When the second node PD1 is at a high level, both the third transistor M3 and the sixth transistor M6 are turned on, so that a connection between the first node PU and the signal control terminal VSS is turned on and a connection between the shift register unit output terminal OUTPUT and the signal control terminal VSS is turned on. The signal control terminal VSS here may be a signal control terminal for applying a low level direct current signal, and therefore the voltage at the first node PU is set to a low level after the third transistor M3 is turned on, and the voltage at the shift register unit output terminal OUTPUT is set to a low level after the sixth transistor M6 is turned on, thereby realizing a function of pulling down the signals at the first node PU and the shift register unit output terminal OUTPUT in a phase in which the second node PD1 is at a high level. Of course, in a specific implementation, the first pull-down control circuit 400 here may also be implemented in other manners. Under the premise that the function of the first pull-down control circuit 400 described above can be realized, a specific structure of the first pull-down control circuit 400 does not affect the protection scope of the present disclosure.

The second node control circuit 600 may comprise an eighth transistor M8, a ninth transistor M9, a tenth transistor M10, and an eleventh transistor M11.

The eighth transistor M8 has a gate coupled to the second clock signal input terminal CLKB, one of a source and a drain also coupled to the second clock signal input terminal CLKB, and the other of the source and the drain coupled to a fourth node PDCN, and is configured to turn on or turn off a connection between the second clock signal input terminal CLKB and the fourth node PDCN under the control of the second clock signal input terminal CLKB. The ninth transistor M9 has a gate coupled to the fourth node PDCN, one of a source and a drain coupled to the second clock signal input terminal CLKB, and the other of the source and the drain coupled to the second node PD1, and is configured to turn on or turn off a connection between the second clock signal input terminal CLKB and the second node PD1 under the control of the fourth node PDCN. The tenth transistor M10 has a gate coupled to the first node PU, one of a source and a drain coupled to the fourth node PDCN, and the other of the source and the drain coupled to the signal control terminal VSS, and is configured to turn on or turn off a connection between the fourth node PDCN and the signal control terminal VSS under the control of the first node PU. The eleventh transistor M11 has a gate coupled to the first node PU, one of a source and a drain coupled to the second node PD1, and the other of the source and the drain coupled to the signal control terminal VSS, and is configured to turn on or turn off a connection between the second node PD1 and the signal control terminal VSS under the control of the first node PU.

An operation principle of the second node control circuit 600 will be described in detail below by taking the eighth transistor M8, the ninth transistor M9, the tenth transistor M10 and the eleventh transistor M11 being N-type transistors as an example.

When the first node PU is at a high level and the second clock signal input terminal CLKB is at a high level, the tenth transistor M10, the eleventh transistor M11 and the eighth transistor M8 are turned on. At this time, a connection between the fourth node PDCN and the signal control terminal VSS is turned on, and meanwhile a connection between the fourth node PDCN and the second clock signal input terminal CLKB is also turned on. At this time, values of the voltage at the signal control terminal VSS and the voltage at the second clock signal input terminal CLKB may be set and/or width-to-length ratios of the tenth transistor M10 and the eighth transistor M8 may be set, so that a current value of the voltage at the fourth node PDCN is lower than a threshold voltage of the ninth transistor M9, and therefore the ninth transistor M9 is turned off. Thereby, the second node PD1 is set to a low level under the control of the signal control terminal VSS.

When the first node is at a high level and the second clock signal input terminal CLKB is at a low level, the tenth transistor M10 and the eleventh transistor M11 are turned on, and the eighth transistor M8 is turned off, so that the fourth node PDCN is set to a low level under the control of the signal control terminal VSS, and therefore the ninth transistor M9 is turned off. Thereby the second node is set to a low level under the control of the signal control terminal VSS.

When the first node is at a low level and the second clock signal input terminal CLKB is at a high level, the tenth transistor M10 and the eleventh transistor M11 are turned off, and the eighth transistor M8 is turned on. As the eighth transistor M8 is turned on, the fourth node is set to a high level under the control of the second clock signal input terminal CLKB. The ninth transistor M9 is turned on after the fourth node PDCN is set to a high level, and thereby the second node PD1 is set to a high level under the control of the fourth node PDCN.

When the first node is at a low level and the second clock signal input terminal CLKB is at a low level, all of the eighth transistor M8, the tenth transistor M10 and the eleventh transistor M11 are turned off. The voltage at the fourth node PDCN is lower than the threshold voltage of the ninth transistor M9, and therefore the ninth transistor M9 is also turned off. At this time, the second node PD1 is in a low level state.

In brief, an operation principle of the second node control circuit 600 described above can be briefly summarized as follows. When the first node PU is at a high level, the second node PD1 is maintained in a low level state. When the first node PU is at a low level, the signal at the second node PD1 is always maintained to be consistent with the signal from the second clock signal input terminal CLKB.

It can be understood that the second node control circuit 600 here can also be implemented in other manners. Under the premise that the function of the second node control circuit 600 described above can be realized, a specific structure of the second node control circuit 600 does not affect the protection scope of the present disclosure.

The second pull-down control circuit 500 may comprise a first transistor M1 and a fourth transistor M4. The first transistor M1 has a gate coupled to the third node PD2, one of a source and a drain coupled to the first node PU, and the other of the source and the drain coupled to the signal control terminal VSS, and is configured to turn on or turn off a connection between the first node PU and the signal control terminal VSS under the control of the third node PD2. The fourth transistor M4 has a gate coupled to the third node PD2, one of a source and a drain coupled to the shift register unit output terminal OUTPUT, and the other of the source and the drain coupled to the signal control terminal VSS, and is configured to turn on or turn off a connection between the shift register unit output terminal OUTPUT and the signal control terminal VSS under the control of the third node PD2.

An operation principle of the second pull-down control circuit 500 is as follows. When the third node PD2 is at a low level under the control of a shift register at a next stage PD1(n+1), both the first transistor M1 and the fourth transistor M4 are turned off, and the signals at the first node PU and the shift register unit output terminal OUTPUT are not affected by the signal control terminal VSS. When the third node PD2 is at a high level under the control of the shift register at the next stage PD1(n+1), both the first transistor M1 and the fourth transistor M4 are turned on, so that a connection between the first node PU and the signal control terminal VSS is turned on, and a connection between the shift register unit output terminal OUTPUT and signal control terminal VSS is turned on. Therefore, the voltage at the first node PU is set to a low level after the first transistor M1 is turned on and the voltage at the shift register unit output terminal OUTPUT is set to a low level after the fourth transistor M4 is turned on, so that the signals at the first node PU and the shift register unit output terminal OUTPUT are further pulled down. Of course, in a practical implementation, the second pull-down control circuit 500 here can also be implemented in other manners. Under the premise that the function of the second pull-down control circuit 500 described above can be realized, a specific structure of the second pull-down control circuit 500 does not affect the protection scope of the present disclosure.

Figure 5:
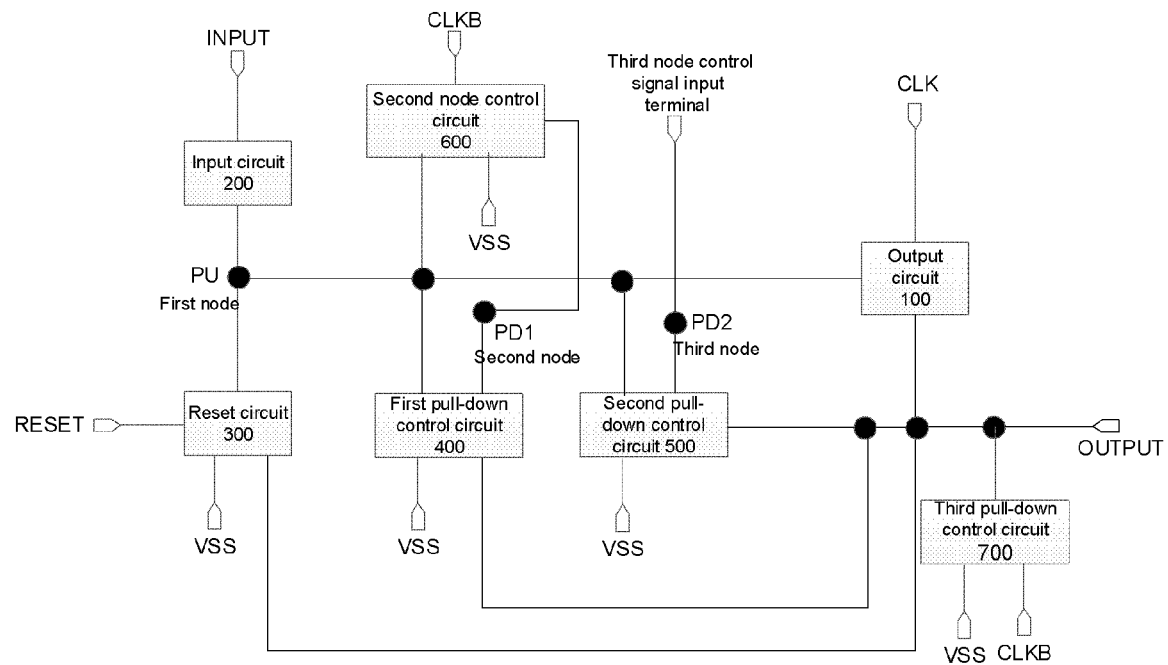
FIG. 5 is a modular structure diagram of another shift register unit according to the present disclosure.

In a specific implementation, in order to further pull down the level at the shift register unit output terminal OUTPUT in a phase in which output of the shift register unit output terminal does not occur, in a specific implementation, as shown in FIG. 5, the shift register unit according to the present disclosure may further comprise a third pull-down control circuit 700.

The third pull-down control circuit 700 is coupled to the second clock signal input terminal CLKB, the shift register unit signal output terminal OUTPUT and the signal control terminal VSS, and is configured to transmit the signal from the signal control terminal VSS to the shift register unit signal output terminal OUTPUT under the control of the second clock signal input terminal CLKB.

Figure 6:
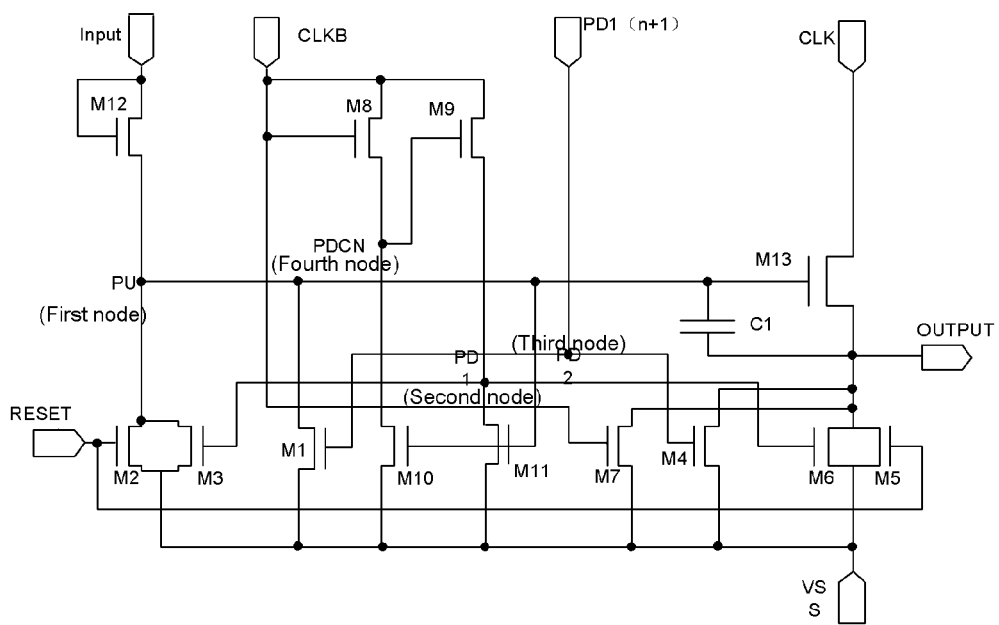
FIG. 6 is a structural circuit diagram of a shift register unit according to the present disclosure.

As shown in FIG. 6, the third pull-down control circuit 700 may comprise a seventh transistor M7. The seventh transistor M7 has a gate coupled to the second clock signal input terminal CLKB, one of a source and a drain coupled to the shift register unit signal output terminal OUTPUT, and the other of the source and the drain coupled to the signal control terminal VSS, and is configured to turn on or turn off a connection between the shift register unit signal output terminal OUTPUT and the signal control terminal VSS when the second clock signal input terminal CLKB is at a high level, so as to further pull down the shift register unit signal output terminal OUTPUT.

Further, the input circuit 200 may specifically comprise a twelfth transistor M12. The twelfth transistor M12 has a gate coupled to the shift register unit input terminal INPUT, one of a source and a drain also coupled to the shift register unit input terminal INPUT, and the other of the source and the drain coupled to the first node PU, and is configured to turn on or turn off a connection between the shift register unit input terminal INPUT and the first node PU under the control of the shift register unit input terminal INPUT.

The output circuit 100 may specifically comprise a thirteenth transistor M13 and a first capacitor C1. The thirteenth transistor M13 has a gate coupled to the first node PU, one of a source and a drain coupled to the first clock signal input terminal CLK, and the other of the source and the drain coupled to the shift register unit output terminal OUTPUT, and is suitable to turn on a connection between the first clock signal input terminal CLK and the shift register unit output terminal OUTPUT under the control of the first node PU; and the first capacitor C1 has one terminal coupled to the first node PU, and the other terminal coupled to the shift register unit signal output terminal OUTPUT.

Under the premise that the basic purpose of the present disclosure can be achieved, specific structures of the input circuit 200 and the output circuit 100 also do not affect the protection scope of the present disclosure.

Figure 7:
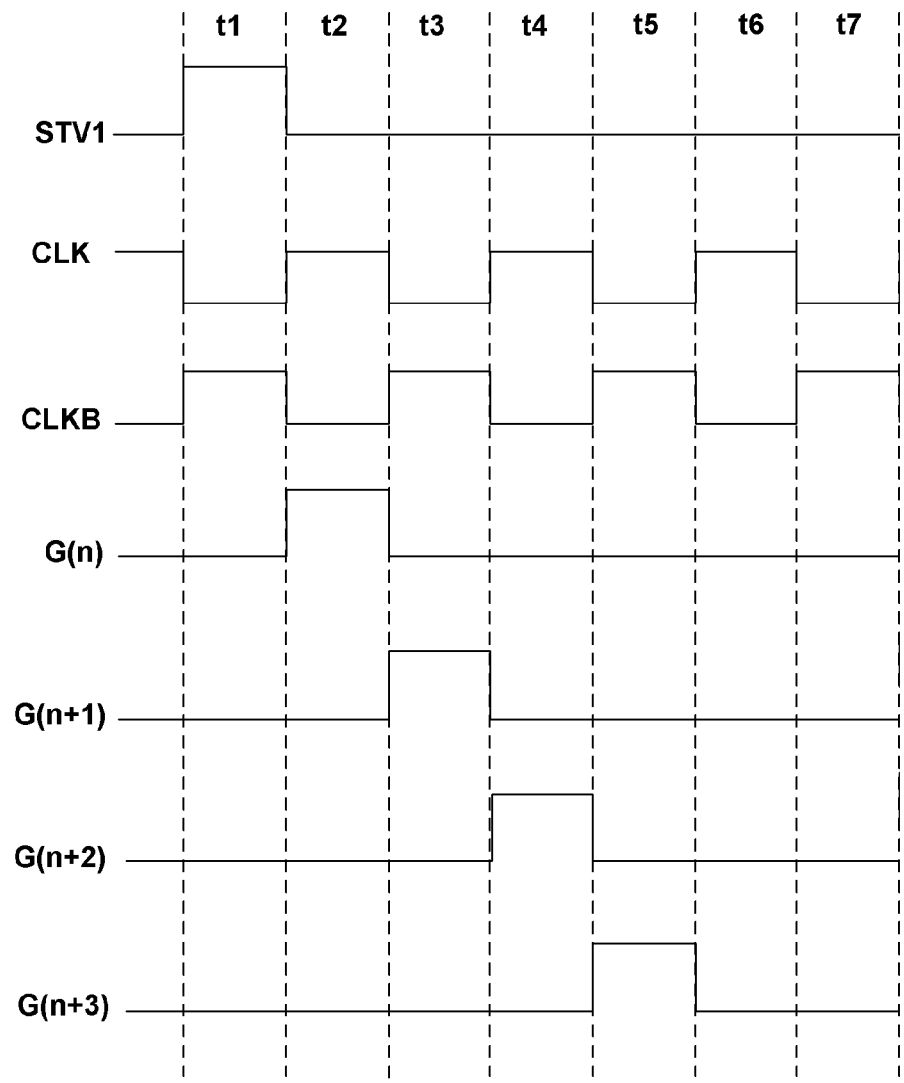
FIG. 7 is a timing diagram corresponding to a shift register unit according to the present disclosure.
Figure 8:
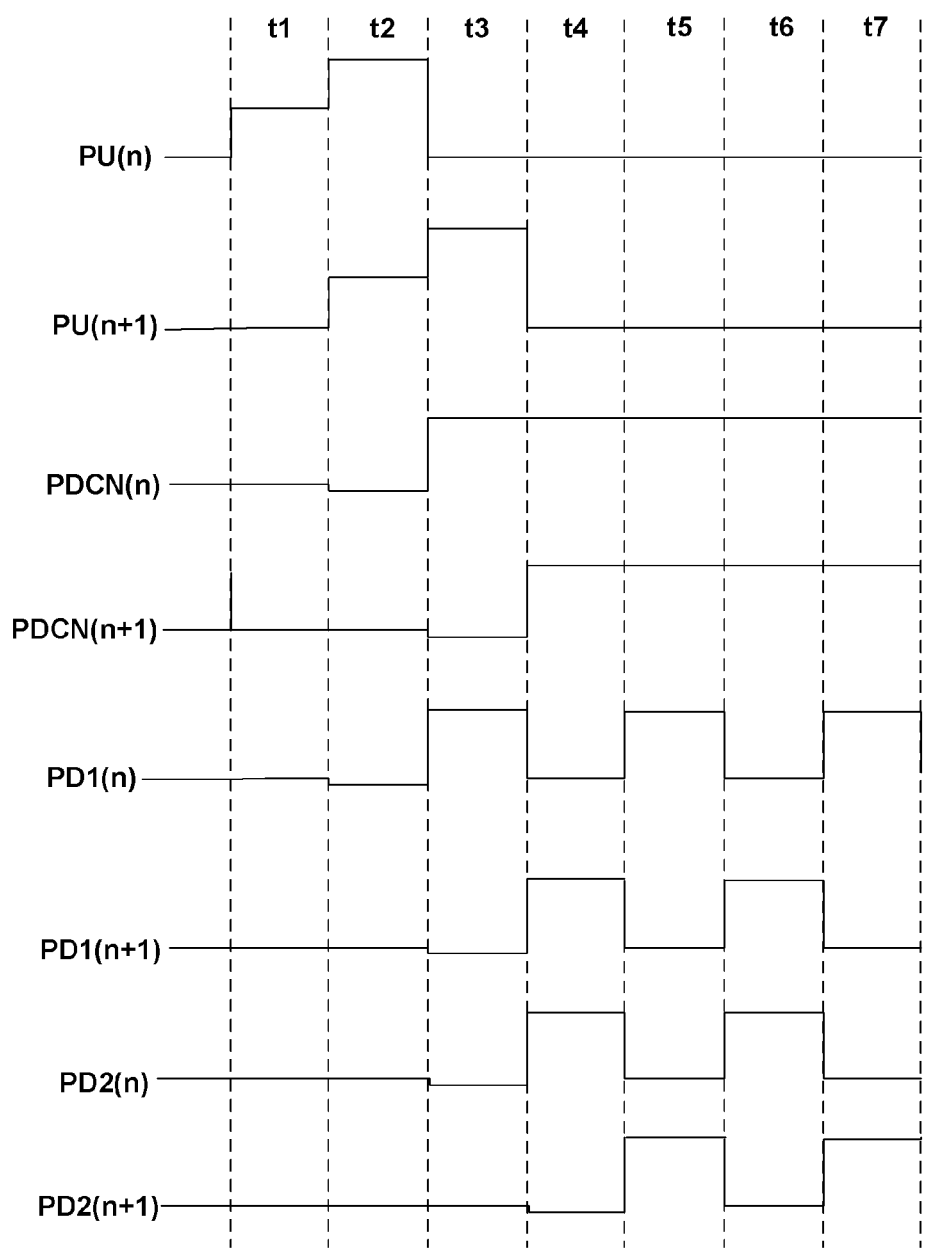
FIG. 8 is a timing diagram corresponding to a shift register unit according to the present disclosure.

One of driving methods for driving a gate scanning circuit composed of a plurality of the shift register units shown in FIG. 5 and a principle of the driving method for implementing functions thereof will be described in detail below in combination with the timing diagrams shown in FIG. 7 and FIG. 8. For the convenience of explanation, an operation principle of various phases will be described in detail below by taking each transistor being an N-type transistor as an example.

The driving method may specifically comprise the following phases.

In an auxiliary reset phase, a shift register unit at the $n^{th}$ stage is reset by a third node PD2 of the shift register unit at the $n^{th}$ stage under the control of a second node PD1 of a shift register unit at the $(n+1)^{th}$ stage, where n is a positive integer. In this way, it is ensured that the $n^{th}$ stage of shift register unit is not affected by a first clock signal input terminal, and can continuously output a stable non-scanning signal in a non-scanning phase.

In a first phase t1, for the shift register at the $n^{th}$ stage, SR(n), a high level (for example, a STart Vertical 1 (STV1) signal when n=1) is input to a shift register unit input terminal INPUT to turn on a transistor M12. As the transistor M12 is turned on, it causes the voltage at a first node PU to be the same as a voltage at the shift register unit input terminal INPUT and to be set to a high level. As the first node PU is pulled up, a transistor M13 is turned on, which causes a connection between a shift register unit output terminal OUTPUT and the first clock signal input terminal CLK to be turned on. As the first clock signal input terminal CLK is at a low level at this time, the shift register unit output terminal OUTPUT is at a low level. As the first node PU is pulled up, a transistor M10 is turned on, which causes a connection between a second node PD1 and a signal control terminal VSS to be turned on. As a low level is normally input to the signal control terminal VSS, the second node PD is set to a low level. When the second node PD is at a low level, it may cause a transistor M3 and a transistor M6 to be turned off; and in this phase, a reset control signal input terminal RESET is at a low level, so that both a transistor M2 and a transistor M5 are turned off. In addition, as the first node PU is pulled up, a transistor M11 is turned on, which further causes a connection between a fourth node PDCN and the signal control terminal VSS to be turned on. However, the fourth node PDCN is also under the control of a second clock signal input terminal CLKB. At this time, the second clock signal input terminal CLKB is at a high level, which causes a transistor M8 to be turned on, so that a connection between the fourth node PDCN and the second clock signal input terminal CLKB is turned on. However, as a voltage at the signal control terminal VSS and a voltage at the second clock signal input terminal CLKB are set and/or width-to-length ratios of the transistor M8 and the transistor M10 are set, a voltage at the fourth node PDCN is lower than a threshold voltage of a transistor M9 and therefore the ninth transistor M9 is turned off at this time. Thereby, the second node PD1 is not be pulled up by the CLKB in this phase. A transistor M7 is turned on under the control of the CLKB, so that the shift register unit output terminal OUTPUT is maintained at a low level in this phase.

In addition, the third node PD2 is coupled to the second node PD1 of the shift register at the $(n+1)^{th}$ stage SR(n+1). As an input from the shift register at the $n^{th}$ stage SR(n) has not been received by the shift register at the $(n+1)^{th}$ stage SR(n+1) at this time, the first node PU is at a low level. At this time, the second node PD1 of the shift register at the $(n+1)^{th}$ stage SR(n+1) is only affected by a CLKB of the shift register at the $(n+1)^{th}$ stage SR(n+1). In this phase, the CLKB of the shift register at the $(n+1)^{th}$ stage SR(n+1) is at a low level, and thus the second node PD1 of the shift register SR(n+1) at the $(n+1)^{th}$ stage is at a low level. Therefore, the third node PD2 of the shift register at the $n^{th}$ stage SR(n) is at a low level in this phase, so that both a transistor M1 and a transistor M4 are turned off, thereby preventing the first node PU from being pulled down. In this phase, a process of pulling up the voltage at the first node PU is realized.

On the other hand, for the shift register at the $(n+1)^{th}$ stage SR(n+1), as a first node PU has not been set to a high level, both a transistor M10 and a transistor M11 are turned off at this time. As the CLKB is at a low level at this time, both a transistor M8 and a transistor M9 are turned off, and thus both the second node PD1 and a fourth node PDCN are at a low level. Therefore, in this phase, the third node PD2 of the shift register at the $n^{th}$ stage SR(n) is not affected by the second node PD1 of the shift register at the $(n+1)^{th}$ stage SR(n+1), and thus the third node PD2 of the shift register at the $n^{th}$ stage SR(n) is maintained in a low level state, thereby preventing the first node PU of the shift register at the $n^{th}$ stage SR(n) from being pulled down in this phase.

In a second phase t2 after the first phase t1, for the shift register at the $n^{th}$ stage SR(n), the shift register unit input terminal INPUT is at a low level, so that the transistor M12 is turned off, and the second clock signal input terminal CLKB is at a low level, so that the transistor M7, the transistor M8 and the transistor M9 are turned off. Thereby, the fourth node PDCN is not affected by the CLKB. The first clock signal input terminal CLK is at a high level, the first node PU is maintained by the first capacitor C1 at a high level at this time, and therefore the transistor M13 is turned on, so that the shift register unit output terminal OUTPUT is set to the level at the first clock signal input terminal CLK, that is, a high level. Under the bootstrap function of the first capacitor C1, the first node PU is further pulled up and the shift register unit output terminal OUTPUT begins to output a high level voltage. In this phase, the first node PU is at a high level, so that the transistor M10 and the transistor M11 are turned on, which causes the fourth node PDCN and the second node PD1 to be set to a low level to maintain the transistor M3 and the transistor M6 to be in a turn-off state, thereby preventing the first node PU from being pulled down.

For the shift register at the $(n+1)^{th}$ stage SR(n+1), in the second phase, a shift register unit input terminal INPUT thereof is at a high level, a first clock signal input terminal CLK thereof is at a low level at this time, and a second clock signal input terminal CLKB thereof is at a high level at this time. Conditions of signals input thereto are exactly the same as those of the shift register at the $n^{th}$ stage SR(n) in the first phase t1. At this time, the first node PU in the shift register at the $(n+1)^{th}$ stage SR(n+1) is also set to a high level, and the corresponding fourth node PDCN and the second node PD1 are set to a low level.

Thus, in the second phase t2, as a shift register unit output terminal OUTPUT of the shift register at the $(n+1)^{th}$ stage SR(n+1) is at a low level, the reset control signal input terminal RESET of the $n^{th}$ shift register SR(n) is also at a low level, which causes the transistor M2 and the transistor M5 to be turned off. Further, the second node PD1 of the shift register at the $(n+1)^{th}$ stage SR(n+1) is also at a low level, so that the third node PD2 of the shift register at the $n^{th}$ stage SR(n) is not set to a high level. Therefore, the transistor M1 and the transistor M4 are turned off, which prevents the first node PU from being set to a low level and ensures that the shift register at the $n^{th}$ stage SR(n) can effectively output a high level.

In a third phase t3, conditions of signals input to the shift register at the $(n+1)^{th}$ stage SR(n+1) are exactly the same as the level states of the key nodes of the shift register at the $n^{th}$ stage SR(n) in the second phase t2. Correspondingly, the states of the key nodes in the shift register at the $(n+1)^{th}$ stage SR(n+1) are exactly the same as the level states of the key nodes of the shift register at the $n^{th}$ stage SR(n) in the second phase t2. At this time, the shift register unit output terminal OUTPUT of the shift register at the $(n+1)^{th}$ stage SR(n+1) begins to output a scanning pulse at a high level, so that the reset control signal input terminal RESET of the shift register at the $n^{th}$ stage SR(n) is set to a high level, which causes the transistor M2 and the transistor M5 to be turned on. At this time, the CLKB is at a high level, so that the transistor M7 and the transistor M8 are turned on, which causes the fourth node PDCN to be set to a high level, and thus the transistor M9 is turned on. Thereby, a connection between the second node PD1 of the shift register at the $n^{th}$ stage SR(n) and the CLKB is turned on, so that the second node PD1 is set to a high level. As the second node PD1 is at a high level, the transistor M3 and the transistor M6 are turned on. Under the control of the transistor M2, the transistor M5, the transistor M3, the transistor M6, and the transistor M7, both the first node PU and the shift register unit output terminal OUTPUT of the shift register at the $n^{th}$ stage SR(n) are set to a low level, so that the shift register unit output terminal OUTPUT of the shift register at the $n^{th}$ stage SR(n) no longer outputs a high level voltage. Thereby, in this phase, the reset circuit 300 (including the transistor M2 and the transistor M5) and the first pull-down control circuit 400 (including the transistor M3 and the transistor M6) realize resetting of the first node PU and the shift register unit output terminal OUTPUT of the shift register at the $n^{th}$ stage SR(n).

It can be understood that, as the first node PU in the shift register at the $n^{th}$ stage SR(n) is not set to a high level after this phase until a first phase of a next frame, after this phase, a level state of the second node PD1 is consistent with a level state of the second clock signal input terminal CLKB, and each time the second clock signal CLKB is at a high level, the first pull-down control circuit 400 (including the transistor M3 and the transistor M6) resets the first node PU and the shift register unit output terminal OUTPUT once.

In addition, in this phase, for the shift register at the $(n+1)^{th}$ stage SR(n+1), the states of the signals input thereto are the same as those of the shift register at the $n^{th}$ stage SR(n) in the second phase t2. Therefore, the second node PD1 in the shift register at the $(n+1)^{th}$ stage SR(n+1) is at a low level in this phase, and thus the third node PD2 in the shift register at the $n^{th}$ stage SR(n) is also at a low level at this time. Thereby, the transistor M1 and the transistor M4 are turned off, and do not play a pull-down role for the first node PU in this phase.

In a fourth phase t4 (i.e., an auxiliary reset phase), conditions of signals input to the shift register at the $(n+1)^{th}$ stage SR(n+1) are exactly the same as the level states of the key nodes of the shift register at the $n^{th}$ stage SR(n) in the third phase t3. Correspondingly, at this time, the states of the key nodes of the shift register at the $(n+1)^{th}$ stage SR(n+1) are exactly the same as the level states of the key nodes of the shift register at the $n^{th}$ stage SR(n) in the third phase t3. That is, in the shift register at the $(n+1)^{th}$ stage SR(n+1), the second node PD1 may be set to a high level. Therefore, the third node PD2 of the shift register at the $n^{th}$ stage SR(n) in this phase is at a high level, so that the transistor M1 and the transistor M4 are turned on to pull down and reset the first node PU and the shift register unit output terminal OUTPUT.

It can be understood that during a period after this phase until the end of this frame, as a signal input to the CLKB of the shift register at the $n^{th}$ stage SR(n) is a signal opposite to a signal at the second node PD1 of the shift register at the $(n+1)^{th}$ stage SR(n+1), under the control of the CLKB and the second node PD1 of the shift register at the $(n+1)^{th}$ stage SR(n+1), the second node PD1 and the third node PD2 are alternatively set to a high level, so that the first pull-down control circuit 300 (including the transistor M3 and the transistor M6) and the second pull-down control circuit 400 (including the transistor M1 and the transistor M4) alternately pull down and reset the first node PU and the shift register unit output terminal OUTPUT, thereby preventing the shift register unit from outputting a scanning pulse in a phase in which the shift register unit should not output the scanning pulse.

It can be seen from the above analysis that, for the shift register unit and the gate driving circuit according to the present disclosure, specific implementations of various circuits do not affect the implementation of the present disclosure under the premise that each circuit in the shift register unit at each stage can achieve the corresponding function, and the corresponding technical solutions should also fall within the protection scope of the present disclosure.

According to some embodiments of the present disclosure, there is further provided a display apparatus comprising the gate scanning circuit described above.

In addition, although N-type transistors are taken as an example in the above embodiments, the present disclosure is not limited thereto. In fact, some embodiments of the present disclosure are equally applicable to P-type transistors.

The display apparatus here may be (but not limited to) any product or component having a display function such as an electronic paper, a mobile phone, a tablet computer, a television, a display, a notebook computer, a digital photo frame, a navigator etc.

In the shift register unit according to some embodiments of the present disclosure, the second pull-down control circuit may be coupled to the third node and is configured to cooperate with the reset circuit and the first pull-down control circuit under the control of the third node control signal input terminal, so as to jointly reset the shift register unit in a phase in which the shift register unit should not output a scanning pulse, thereby effectively preventing the shift register unit from outputting the scanning pulse in the phase in which the shift register unit should not output the scanning pulse.

Finally, it should be illustrated that the above embodiments are merely intended for describing the technical solutions according to the present disclosure rather than limiting the present disclosure. Although the present disclosure is described in detail with reference to the above embodiments, it should be understood by those of ordinary skill in the art that modifications can be made to the technical solutions described in the above embodiments, or equivalent substitutions can be made to a part of technical features thereof. These modifications or substitutions do not cause the essence of the corresponding technical solutions to depart from the spirit and scope of the technical solutions according to the embodiments of the present disclosure.

We claim:

1. A gate scanning circuit, comprising:
a plurality of cascaded shift register units, each of which comprises:
an output circuit coupled to a first node, a first clock signal input terminal, and a shift register unit output terminal, and configured to transmit a signal from the first clock signal input terminal to the shift register unit output terminal under the control of the first node;
an input circuit coupled to the first node and a shift register unit input terminal, and configured to transmit a signal from the shift register unit input terminal to the first node under the control of the shift register unit input terminal;
a reset circuit coupled to a reset control signal input terminal, the first node, the shift register unit signal output terminal, and a signal control terminal, and configured to transmit a signal from the signal control terminal to the first node and the shift register unit signal output terminal under the control of the reset control signal input terminal;
a first pull-down control circuit coupled to a second node, the first node, the shift register unit signal output terminal, and the signal control terminal, and configured to transmit the signal from the signal control terminal to the first node and the shift register unit signal output terminal under the control of the second node;
a second pull-down control circuit coupled to a third node, the first node, the shift register unit signal output terminal, and the signal control terminal, and configured to transmit the signal from the signal control terminal to the first node and the shift register unit signal output terminal under the control of the third node; and
a second node control circuit coupled to the first node, the second node, a second clock signal input terminal, and the signal control terminal, and configured to output the signal from the signal control terminal or a signal from the second clock signal input terminal to the second node under the control of the first node and the second clock signal input terminal; and
a plurality of clock signal lines,
wherein each of the shift register units at odd-numbered stages has a first clock signal input terminal coupled to a first clock signal line, and a second clock signal input terminal coupled to a second clock signal line; and each of the shift register units at even-numbered stages has a first clock signal input terminal coupled to the second clock signal line, and a second clock signal input terminal coupled to the first clock signal line; and
wherein in shift register units at two adjacent stages, the shift register unit at a previous stage has a shift register unit output terminal coupled to a shift register unit input terminal of the shift register unit at a next stage, a reset control signal input terminal coupled to a shift register unit output terminal of the shift register unit at the next stage, and a third node coupled to a second node of the shift register unit at the next stage.

2. A driving method for driving the gate scanning circuit according to claim 1, the driving method comprising:
in an auxiliary reset phase, resetting, by a third node of a shift register unit at an $n^{th}$ stage, the shift register unit at the $n^{th}$ stage under the control of a second node of a shift register unit at an $(n+1)^{th}$ stage, where n is a positive integer.

3. The driving method according to claim 2, further comprising:
in a first phase, for the shift register unit at the $n^{th}$ stage, inputting a high level to its shift register unit input terminal, inputting a low level to its first clock signal input terminal, inputting a high level to its second clock signal input terminal, inputting a low level to its signal control terminal, inputting a low level to its reset control signal input terminal, and inputting a low level to the third node, so that a low level is output by the shift register unit output terminal at the $n^{th}$ stage.

4. The driving method according to claim 2, further comprising:
in a second phase, for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a low level to the third node, so that a high level is output by the shift register unit output terminal at the $n^{th}$ stage.

5. The driving method according to claim 2, further comprising:
in a third phase, for the shift register unit at the $n^{th}$ stage, inputting a low level to its shift register unit input terminal, inputting a low level to its first clock signal input terminal, inputting a high level to its second clock signal input terminal, inputting a low level to its signal control terminal, inputting a high level to its reset control signal input terminal, and inputting a low level to the third node, so that a low level is output by the shift register unit output terminal at the $n^{th}$ stage.

6. The driving method according to claim 3, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

7. A display apparatus, comprising the gate scanning circuit according to claim 1.

8. The driving method according to claim 3, further comprising:
in a second phase, for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a low level to the third node, so that a high level is output by the shift register unit output terminal at the $n^{th}$ stage.

9. The driving method according to claim 4, further comprising:
in a third phase, for the shift register unit at the $n^{th}$ stage, inputting a low level to its shift register unit input terminal, inputting a low level to its first clock signal input terminal, inputting a high level to its second clock signal input terminal, inputting a low level to its signal control terminal, inputting a high level to its reset control signal input terminal, and inputting a low level to the third node, so that a low level is output by the shift register unit output terminal at the $n^{th}$ stage.

10. The driving method according to claim 8, further comprising:
in a third phase, for the shift register unit at the nth stage, inputting a low level to its shift register unit input terminal, inputting a low level to its first clock signal input terminal, inputting a high level to its second clock signal input terminal, inputting a low level to its signal control terminal, inputting a high level to its reset control signal input terminal, and inputting a low level to the third node, so that a low level is output by the shift register unit output terminal at the nth stage.

11. The driving method according to claim 2, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

12. The driving method according to claim 3, further comprising:
in a third phase, for the shift register unit at the $n^{th}$ stage, inputting a low level to its shift register unit input terminal, inputting a low level to its first clock signal input terminal, inputting a high level to its second clock signal input terminal, inputting a low level to its signal control terminal, inputting a high level to its reset control signal input terminal, and inputting a low level to the third node, so that a low level is output by the shift register unit output terminal at the $n^{th}$ stage.

13. The driving method according to claim 4, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

14. The driving method according to claim 8, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

15. The driving method according to claim 5, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

16. The driving method according to claim 12, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

17. The driving method according to claim 9, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

18. The driving method according to claim 10, wherein the step of in the auxiliary reset phase, resetting, by the third node of the shift register unit at the $n^{th}$ stage, the shift register unit at the $n^{th}$ stage under the control of the second node of the shift register unit at the $(n+1)^{th}$ stage comprises:
for the shift register unit at the $n^{th}$ stage, inputting a low level to its shift register unit input terminal, inputting a high level to its first clock signal input terminal, inputting a low level to its second clock signal input terminal, inputting a low level to its signal control terminal, inputting a low level to its reset control signal input terminal, and inputting a high level to the third node, so that a low level is output by the shift register unit output terminal at the $n^{th}$ stage.

\* \* \* \* \*